(12) United States Patent
Ju

(10) Patent No.: US 8,039,944 B2
(45) Date of Patent: Oct. 18, 2011

(54) ELECTRICAL CONNECTION DEVICE AND ASSEMBLY METHOD THEREOF

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 409 days.

(21) Appl. No.: 12/222,255

(22) Filed: Aug. 6, 2008

(65) Prior Publication Data

US 2009/0102041 A1    Apr. 23, 2009

(30) Foreign Application Priority Data

Oct. 17, 2007 (CN) .......................... 2007 1 0030878

(51) Int. Cl.
*H01L 23/48* (2006.01)

(52) U.S. Cl. .............. 257/690; 257/57; 257/E21.506; 257/E23.01; 438/53; 438/63; 438/108; 438/637

(58) Field of Classification Search ............... 438/117; 257/690, E21.506, E23.01, 773, 780, 781, 257/784; 439/63, 53, 108, 637, 954
See application file for complete search history.

(56) References Cited

U.S. PATENT DOCUMENTS

| | | | | |
|---|---|---|---|---|
| 3,842,189 A | * | 10/1974 | Southgate | 174/547 |
| 4,553,192 A | * | 11/1985 | Babuka et al. | 361/743 |
| 4,751,199 A | * | 6/1988 | Phy | 29/827 |
| 4,793,814 A | * | 12/1988 | Zifcak et al. | 439/66 |
| 4,976,626 A | * | 12/1990 | Dibble et al. | 439/67 |
| 4,993,955 A | * | 2/1991 | Savant | 439/73 |
| 5,061,192 A | * | 10/1991 | Chapin et al. | 439/66 |
| 5,096,426 A | * | 3/1992 | Simpson et al. | 439/66 |
| 5,142,447 A | * | 8/1992 | Cooke et al. | 361/679.4 |
| 5,290,192 A | * | 3/1994 | Espenshade et al. | 439/266 |
| 5,320,550 A | * | 6/1994 | Uratsuji et al. | 439/266 |
| 5,324,205 A | * | 6/1994 | Ahmad et al. | 439/66 |
| 5,328,383 A | * | 7/1994 | Savant | 439/266 |
| 5,364,284 A | * | 11/1994 | Tohyama et al. | 439/266 |
| 5,378,160 A | * | 1/1995 | Yumibe et al. | 439/66 |
| 5,531,022 A | * | 7/1996 | Beaman et al. | 29/850 |
| 5,574,384 A | * | 11/1996 | Oi | 324/750.05 |
| 5,772,451 A | * | 6/1998 | Dozier et al. | 439/70 |
| 5,810,607 A | * | 9/1998 | Shih et al. | 439/66 |
| 5,959,354 A | * | 9/1999 | Smith et al. | 257/734 |
| 6,016,254 A | * | 1/2000 | Pfaff | 361/769 |

(Continued)

FOREIGN PATENT DOCUMENTS

CN     2927364 Y    7/2007

*Primary Examiner* — Drew Richards
*Assistant Examiner* — Ankush Singal
(74) *Attorney, Agent, or Firm* — Rosenberg, Klein & Lee

(57) ABSTRACT

An electrical connection device and assembly method thereof includes a substrate with a plurality of contacting portions arranged on a surface thereof; a chip module having a plurality of terminals inclining in one direction and compressed and contacted with the contacting portions correspondingly; at least one restricting structure which restricts the chip module to move a distance relative to the substrate depending on the compression deformation of the terminals when the terminals are contacted with the contacting portions; and at least one elastic element just producing deformation when the chip module moves the distance. When the terminals are compressed and contacted with the contacting portions, the restricting structure restricts the chip module to move the distance depending on the compression deformation of the terminals, so that the elastic element just produces deformation, which make the chip module only move in the direction opposite to the deformation direction of the terminals.

11 Claims, 11 Drawing Sheets

U.S. PATENT DOCUMENTS

| | | | | |
|---|---|---|---|---|
| 6,029,344 A * | 2/2000 | Khandros et al. | | 29/874 |
| 6,062,879 A * | 5/2000 | Beaman et al. | | 439/91 |
| 6,078,500 A * | 6/2000 | Beaman et al. | | 361/704 |
| 6,135,783 A | 10/2000 | Rathburn | | 439/66 |
| 6,286,208 B1 * | 9/2001 | Shih et al. | | 29/879 |
| 6,344,752 B1 * | 2/2002 | Hagihara et al. | | 324/756.03 |
| 6,505,811 B1 * | 1/2003 | Barron et al. | | 251/129.01 |
| 6,525,551 B1 * | 2/2003 | Beaman et al. | | 324/754 |
| 6,534,856 B1 * | 3/2003 | Dozier et al. | | 257/698 |
| 6,573,609 B2 * | 6/2003 | Fjelstad et al. | | 257/778 |
| 6,579,104 B1 * | 6/2003 | Bishop et al. | | 439/66 |
| 6,608,385 B2 * | 8/2003 | Zhou et al. | | 257/773 |
| 6,713,374 B2 * | 3/2004 | Eldridge et al. | | 438/611 |
| 6,836,024 B2 * | 12/2004 | Mori et al. | | 257/780 |
| 6,885,106 B1 * | 4/2005 | Damberg et al. | | 257/777 |
| 6,891,255 B2 * | 5/2005 | Smith et al. | | 257/674 |
| 6,913,468 B2 * | 7/2005 | Dozier et al. | | 439/66 |
| 6,917,102 B2 * | 7/2005 | Zhou et al. | | 257/698 |
| 6,920,689 B2 * | 7/2005 | Khandros et al. | | 29/860 |
| 6,937,042 B2 * | 8/2005 | Yoshida et al. | | 324/754 |
| 6,946,725 B2 * | 9/2005 | Hacke | | 257/692 |
| 6,975,518 B2 * | 12/2005 | Frutschy et al. | | 361/769 |
| 6,979,217 B1 * | 12/2005 | Wang | | 439/264 |
| 7,021,942 B2 * | 4/2006 | Grant et al. | | 439/66 |
| 7,021,946 B2 * | 4/2006 | Koizumi et al. | | 439/91 |
| 7,033,190 B1 * | 4/2006 | Chen | | 439/159 |
| 7,057,295 B2 * | 6/2006 | Ju | | 257/784 |
| 7,086,866 B1 * | 8/2006 | Folan et al. | | 439/53 |
| 7,210,225 B2 * | 5/2007 | Olson et al. | | 29/882 |
| 7,214,099 B2 * | 5/2007 | Kikuchi et al. | | 439/630 |
| 7,391,121 B2 * | 6/2008 | Otremba | | 257/784 |
| 7,407,413 B2 * | 8/2008 | Minich | | 439/607.1 |
| 7,458,816 B1 * | 12/2008 | Mathieu et al. | | 439/66 |
| 7,482,822 B2 * | 1/2009 | Cooper et al. | | 324/756.03 |
| 7,482,823 B2 * | 1/2009 | Gleason et al. | | 324/754 |
| 7,514,799 B2 * | 4/2009 | Ju | | 257/781 |
| 7,534,654 B2 * | 5/2009 | Pedersen et al. | | 438/110 |
| 7,637,750 B1 * | 12/2009 | Polnyi | | 439/66 |
| 2001/0010946 A1 * | 8/2001 | Morris et al. | | 438/117 |
| 2004/0096994 A1 * | 5/2004 | Eldridge | | 438/15 |
| 2004/0257098 A1 * | 12/2004 | Satou et al. | | 324/754 |
| 2005/0255633 A1 * | 11/2005 | Hacke | | 438/106 |
| 2007/0045874 A1 * | 3/2007 | Eldridge et al. | | 257/784 |
| 2007/0281501 A1 * | 12/2007 | Ju | | 439/66 |
| 2008/0153364 A1 * | 6/2008 | Tanaka et al. | | 439/862 |
| 2008/0160815 A1 * | 7/2008 | Ju | | 439/331 |
| 2008/0265924 A1 * | 10/2008 | Barabi et al. | | 324/758 |

* cited by examiner

ELECTRICAL CONNECTION DEVICE AND ASSEMBLY METHOD THEREOF

BACKGROUND OF THE INVENTION

1. Field of the Invention

The present invention relates to an electrical connection device and assembly method thereof for connecting a chip module with a substrate, especially to an electrical connection device with a restricting structure and assembly method thereof, wherein the restricting structure can make a chip module move relative to a substrate.

2. Description of Related Art

Generally, a conventional chip module (especially to a central processing unit, CPU) has a plurality of pins extending on a surface thereof relative to a substrate. The substrate has a plurality of contacting portions formed thereon, corresponding to the pins. The pins of the chip module contact the corresponding contacting portions of the substrate to achieve electrical contact between the chip module and the substrate.

For improving operation speed of chip modules of computers, the number of pins of the chip modules increase to satisfy performance requirements of the chip modules. However, when the number of the pins of the chip modules increasing, the pins are denser in arrangement and have a smaller distance therebetween, so that interference signals between adjacent pins are produced. For avoiding producing the interference signals, the distance between adjacent pins must be increased. In conventional methods, the pins are disposed on the chip modules in an inclined way so as to increase the distance between adjacent pins and improve the compression contact between the pins and the contacting portions of the substrates.

Since the pins of the chip modules are inclined, the pins of the chip modules will be compressed to deform and drive the chip modules to move a distance relative to the substrates when they contact with the contacting portions of the substrate, so that the pins and the contacting portions move relative to each other and the pins cannot effectively contact the contacting portions, and the pins cannot even be correctly aligned with the corresponding contacting portions on the substrate, which influences the electrical contact between the chip module and the substrate strongly.

Hence, there is a need for a new electrical connection device to overcome the above shortcomings.

SUMMARY OF THE INVENTION

An object of the present invention is to provide an electrical connection device and assembly method thereof wherein the electrical connection device has a restricting structure so that a chip module can move relative to a substrate.

To achieving the above-mentioned object, an electrical connection device in accordance with the present invention is provided. The electrical connection device comprises: a substrate with a plurality of contacting portions arranged on a surface thereof; a chip module which has an engaging surface and a plurality of terminals formed on the engaging surface, the terminals inclining in one direction and compressed and contacted with the plurality of contacting portions correspondingly; at least one restricting structure which restricts the chip module to move a distance relative to the substrate depending on the compression deformation of the terminals when the terminals are compressed and contacted with the plurality of the contacting portions; and at least one elastic element located on the movement path of the chip module, wherein the chip module moves the distance so as to just make the elastic element deform.

The present invention further provides an electrical connection device, and the electrical connection device comprises: a substrate with a plurality of contacting portions arranged on a surface thereof; a chip module which has an engaging surface and a plurality of terminals formed on the engaging surface, the terminals inclining in one direction and compressed and contacted with the plurality of contacting portions correspondingly; at least one restricting structure which has a track formed in the substrate and a fixing block fixed on the surface of the chip module, the fixing block extending into the track correspondingly; wherein the terminals are compressed and contacted with the contacting portions so that the chip module moves along a movement path and the restricting structure just restricts the fixing block, thereby the fixing block moves in the track synchronously.

The present invention further provides an electrical connection device, and the electrical connection device comprises: a substrate with a plurality of contacting portions arranged on a surface thereof; a chip module which has an engaging surface and a plurality of terminals formed on the engaging surface, the terminals inclining in one direction and compressed and contacted with the plurality of contacting portions correspondingly; and at least one restricting structure surrounding the chip module; wherein when the terminals contact with the contacting portions, the chip module is permitted to move along a movement path and restricted not to move along the movement path.

The present invention further provides an electrical connection device, and the electrical connection device comprises: a substrate with a plurality of contacting portions arranged on a surface thereof; a chip module which has an engaging surface and a plurality of terminals formed on the engaging surface, the terminals inclining in one direction and compressed and contacted with the plurality of contacting portions correspondingly; and at least one restricting structure which restricts the chip module to move a distance relative to the substrate depending on the compression deformation of the terminals when the terminals are compressed and contacted with the plurality of the contacting portions.

The present invention further provides a method for assembling an electrical connection device which comprises a substrate, a chip module and at least one restricting module, wherein the substrate includes a plurality of contacting portions arranged on a surface thereof and the chip module has an engaging surface and a plurality of terminals disposed on the engaging surface, the terminals inclining in one direction and corresponding to the plurality of terminals respectively, the method includes the steps of: moving the chip module over the substrate so that the chip module abuts against one side of the restricting structure; moving the chip module towards the substrate along the restricting structure till the terminals are compressed and contacted with the contacting portions; and the chip module moving a distance depending on the compression deformation of the terminals.

In the present invention, when the terminals of the chip module are compressed and contacted with the contacting portions of the substrate, the restricting structure can restrict the chip module to move a distance depending on the compression deformation of the terminals. Furthermore, during the movement of the chip module, the elastic element just produces deformation, which make the chip module move in the direction opposite to the deformation direction of the terminals so that the terminals have a good contact with the contacting portions.

DETAILED DESCRIPTION OF THE PREFERRED EMBODIMENTS

To further understand the present invention, please refer to the drawings and the following detailed description related the present invention.

Figure 1:
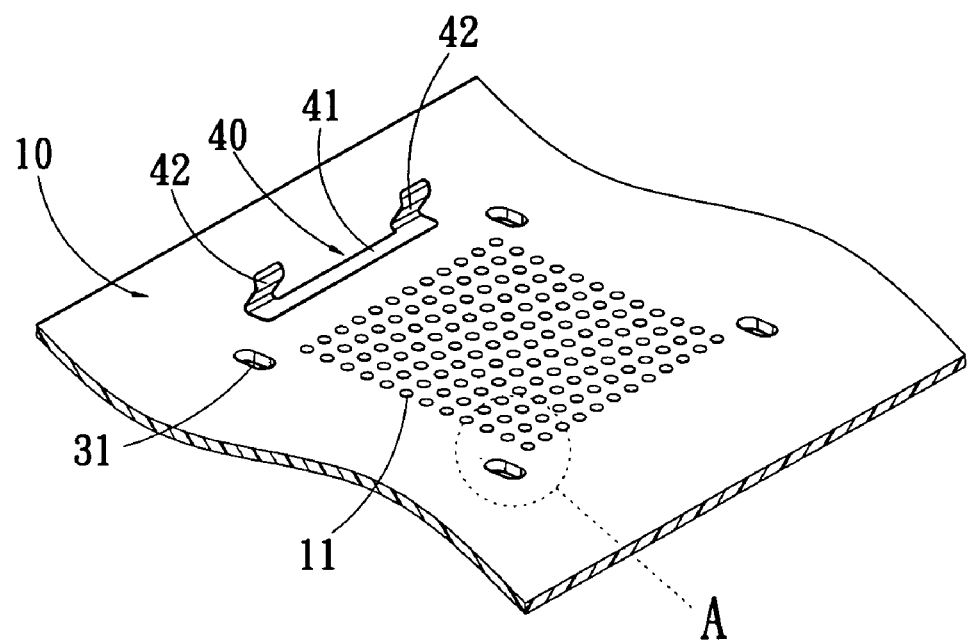
FIG. 1 is a perspective view of a chip module of the present invention.
Figure 2:
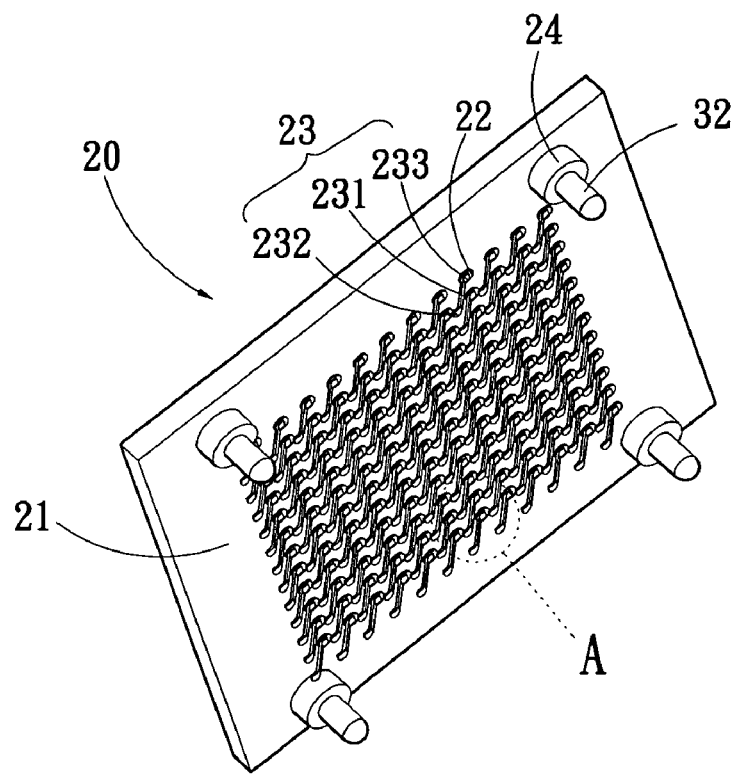
FIG. 2 is a perspective view of a substrate of the present invention.
Figure 3:
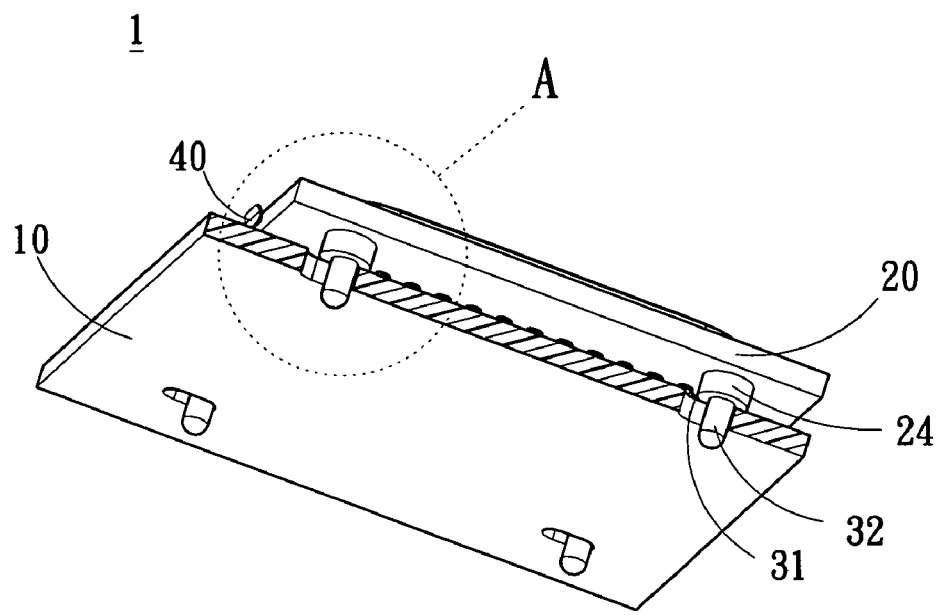
FIG. 3 is a partially cross-sectional view of the chip module in FIG. 1 and the substrate in FIG. 2, after assembly.

Please refer to FIGS. 1-6 illustrating a first embodiment of an electrical connection device 1 according to the present invention. As shown in FIGS. 1-3, the electrical connection device 1 of the present invention includes a substrate 10 and a chip module 20 disposed on the substrate 10.

Figure 1A:
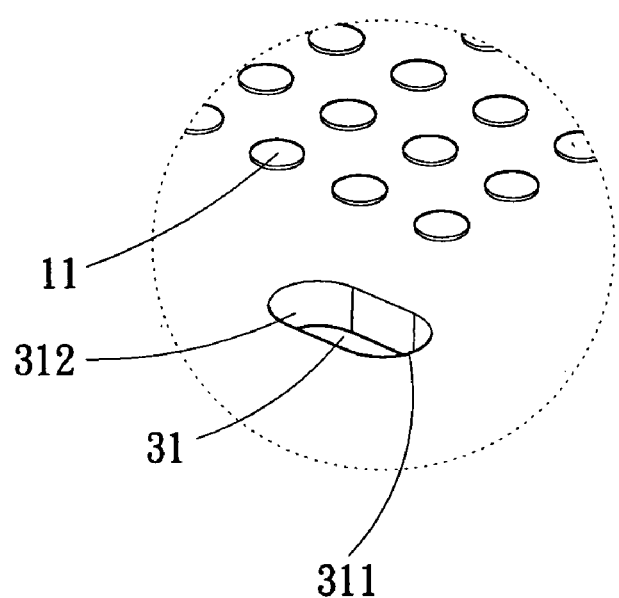
FIG. 1A is a partially enlarged view of the chip module in FIG. 1.

As shown in FIG. 1 and FIG. 1A, the substrate 10 is a circuit board. Alternatively, the substrate 10 may be also a main body of an electrical connector. The substrate 10 has a plurality of contacting portions 11 arranged in a certain order thereon and a plurality of tracks 31 formed on the periphery of the contacting portions 11. Actually, each track 31 is an approximate oval through-hole and includes a first wall 311 and a second wall 312 opposite to the first wall 311.

Figure 2A:
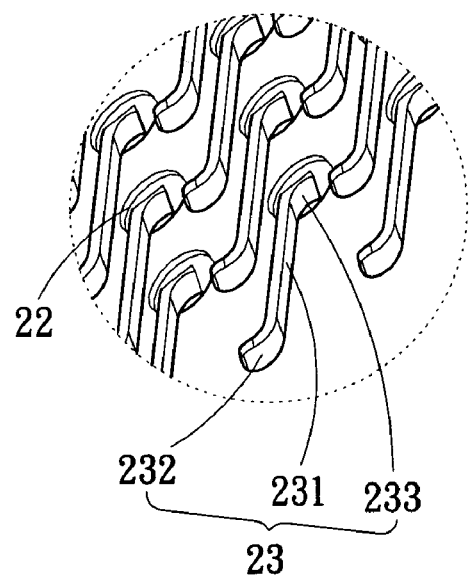
FIG. 2A is a partially enlarged view of the substrate in FIG. 2.

As shown in FIG. 2 and FIG. 2A, the chip module 20 is approximately shaped like a rectangle and has an engaging surface 21 opposite to the substrate 10. A plurality of welding pads 22 are arranged on the engaging surface 21, and an equal number of terminals 23 are disposed on the welding pads 22, inclined in one direction. Each terminal 23 is fixed on a corresponding welding pad 22 via compression joint or welding, and pressed to contact with a corresponding contacting portion 11 of the substrate 10.

Each terminal 23 has an elastic portion 231, a contacting end 232 and a fixing end 233 which extend from two ends of the elastic portion 231 respectively. The contacting end 232 and the contacting portion 11 of the substrate 10 are correspondingly pressed to contact with each other. The fixing ends 233 are welded on the corresponding welding pads 22 or pressed to contact with the corresponding welding pads 22, in order to fix the terminals 23 on the corresponding welding pads 22.

The chip module 20 has a plurality of supporting units 24 and a plurality of fixing blocks 32 arranged on the periphery of the terminals 23. The supporting units 24 are located on the surface 21 of the chip module 20. Actually, the fixing blocks 32 are column-shaped and located on the supporting units 24. The diameter of each fixing block 32 is smaller than the smallest width of the tracks 31 of the substrate 10.

Figure 3A:
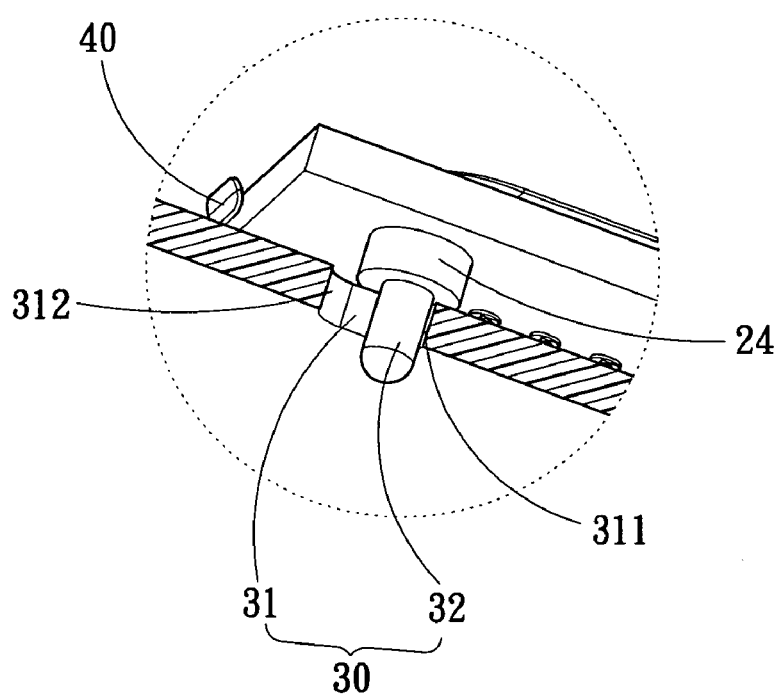
FIG. 3A is a partially enlarged view of the assembled view of the chip module and the substrate in FIG. 3.

When the chip module 20 is assembled on the substrate 10, the supporting units 24 may support the chip module 20, so that there is a distance between the chip module 20 and the substrate 10. The fixing blocks 32 move in the corresponding tracks 31 of the substrate 10. The fixing blocks 32 may slide from the first walls 311 of the tracks 31 to the second walls 312, and the left and the right sides of the fixing blocks 32 are restricted by the tracks 31 respectively. The fixing blocks 32 and the tracks 31 of the substrate 10 form a restricting structure 30. The restricting structure 30 may selectively have a fixing block 32 disposed on the chip module 20 and a track 31 formed in the substrate 10 (as shown in FIG. 3 and FIG. 3A). The following is to describe the functions and efficacy of the restricting structure 30 in detail.

As shown in FIG. 1 and FIG. 1A, the electrical connection device 1 of the present invention further has at least one elastic element 40 disposed on the surface of the substrate 10. In the embodiment, only one elastic element 40 is disposed on the substrate 10. The elastic element 40 is a tensile resistance spring, of which one end is welded or fixed on the substrate 10, and the other end abuts against the chip module 20. The elastic element 40 includes a lengthways base portion 41 and two elastic portions 42 respectively extending from two ends of the substrate 41. The base portion 41 is welded or fixed on the substrate 10 and the elastic portions 42 abut against the chip module 20.

Figure 4:
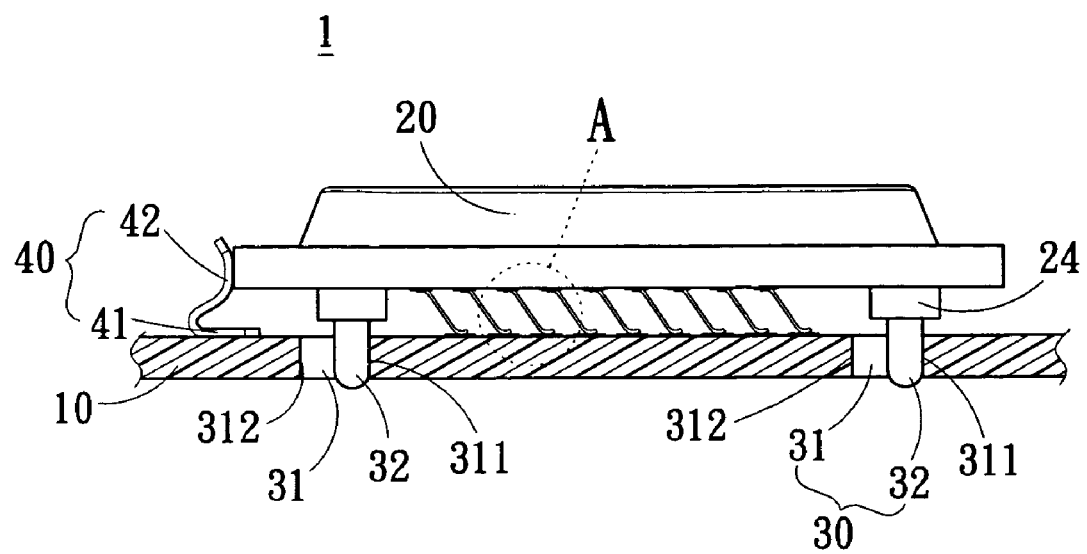
FIG. 4 is a cross-sectional assembled view of the chip module and the substrate in FIG. 3, before compression.
Figure 4A:
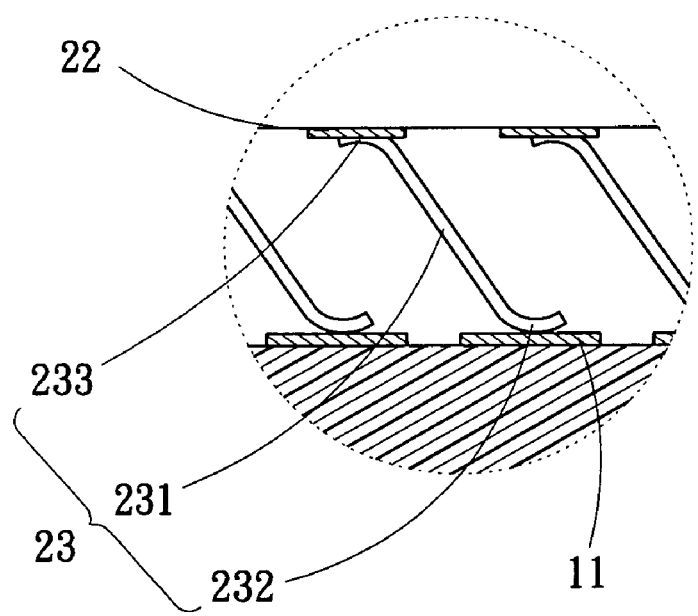
FIG. 4A is a partially enlarged view of the assembled view in FIG. 4.

As shown in FIGS. 3-6, simultaneously, please refer to FIG. 1 and FIG. 2, first, disposing the chip module 20 on the substrate 10. As shown in FIG. 4 and FIG. 4A, the contacting ends 232 of the terminals 23 of the chip module 20 are pressed to contact with the contacting portions 11 of the substrate 10, one side of the chip module 20 abuts against the elastic element 40, and the fixing blocks 32 are located in the corresponding tracks 31 and abut against the first walls 311 of the tracks 31.

Since the terminals 23 are disposed on the chip module 20 in an inclined way, the terminals 23 cause an elastic deformation when they engage with the contacting portions 11 of the substrate 10, so that the terminals 23 have a good contact with the contacting portions 11 of the substrate 10.

Figure 5:
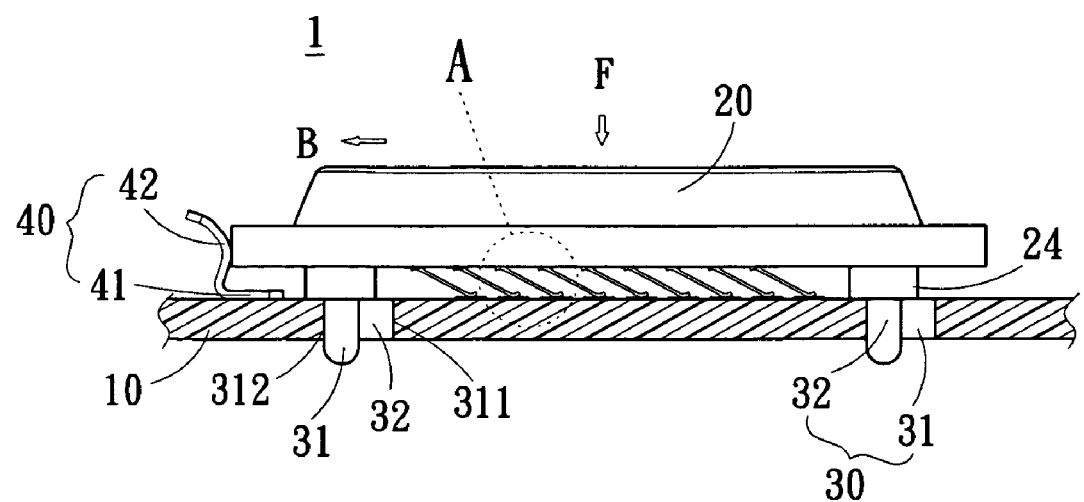
FIG. 5 is a cross-sectional assembled view of the chip module and the substrate in FIG. 4, after compression.
Figure 5A:
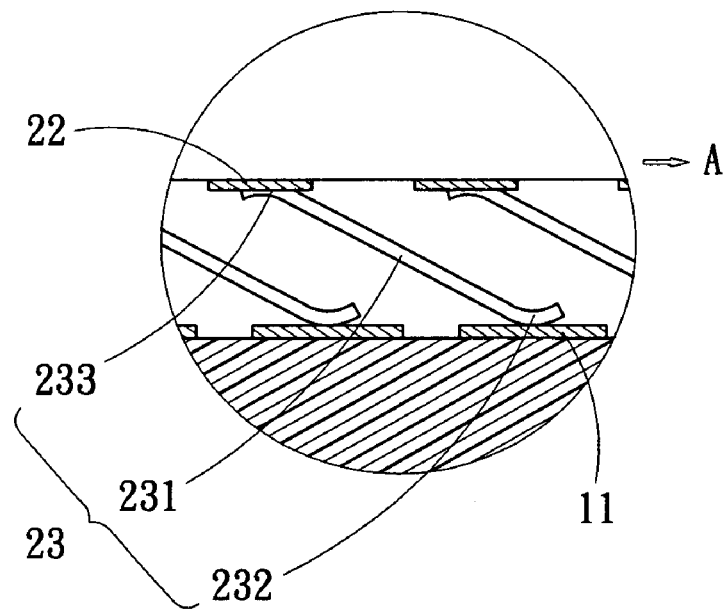
FIG. 5A is a partially enlarged view of the assembled view of the chip module and the substrate in FIG. 5.
Figure 6:
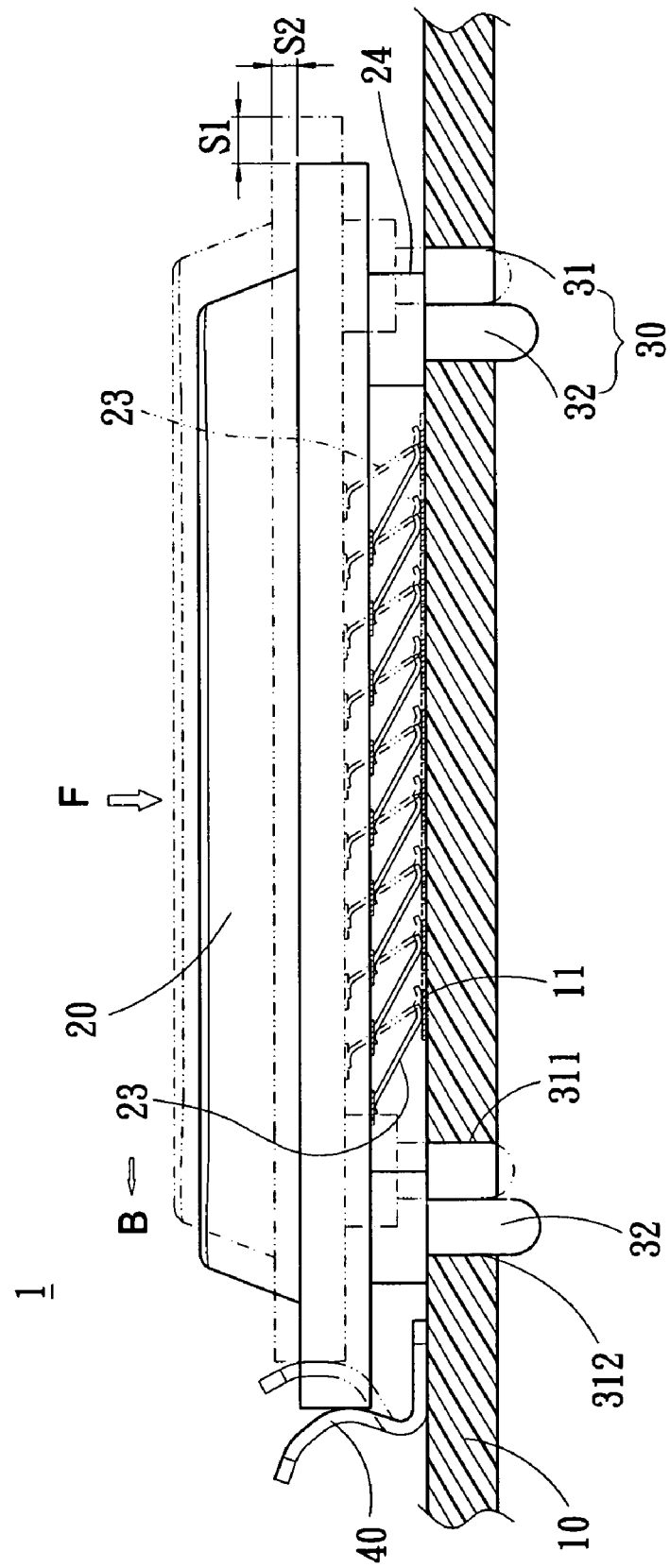
FIG. 6 is a cross-sectional assembled view of the chip module and the substrate in FIG. 4 and FIG. 5, before compression and after compression.

Please refer to FIG. 5, FIG. 5A and FIG. 6, FIG. 6 is a cross-sectional assembled view of the chip module and the substrate 10, before compression and after compression. In FIG. 6, dotted lines indicate a view of the chip module and the substrate before compression and real lines indicate a view of the chip module and the substrate after compression. The above figures illustrate the changes of the chip module and the substrate, before compression and after compression.

Then, exert force (Force F shown in FIG. 5) to make the chip module 20 and the substrate 10 engage with each other closely. When the contacting end 232 of the terminals 23 are pressed on the contacting portions 11 of the substrate 10, if keeping on exerting force, the elastic portions 231 of the terminals 23 will incline toward one direction (the contacting ends 232 face to direction A in FIG. 5A) and cause a proper elastic deformation and the terminals 23 will drive the chip module 20 to move toward the direction (Direction B in FIG. 5) opposite to the deformation direction of the terminals 23. At the same time, the elastic elements 40 will lead the chip module 20 to move toward the direction (Direction B in FIG. 5) opposite to the deformation direction of the terminals 23, thereby ensuring that the terminals 23 contact with the contacting portions 11 of the substrate 10, correspondingly.

Accordingly, the chip module 20 may move a distance relative to the substrate 10 depending on the compression deformation of the terminals 23. As shown in FIG. 6, the horizontal movement distance is S1 and the vertical movement distance is S2. Since the supporting units 24 are disposed between the chip module 20 and the substrate 10 to support the chip module 20, it is avoided that the chip module 20 moves downwards continuously.

During the movement of the chip module 20, when the fixing blocks 32 slide from the first walls 311 of the tracks 31 to the second walls 312, the tracks 31 may restrict the fixing blocks 32 so that the fixing blocks 32 move in synchronism with the chip module 20 in the tracks 31.

The fixing blocks 32 and the tracks 31 simultaneously restrict the chip module 20 to move relative to the substrate 10 depending on the compression deformation of the terminals 23. The total length of each track 31 may ensure the movement distance. The fixing blocks 32 may be restricted by the tracks 31, respectively relative to the left and the right sides of the movement path. During the movement of the chip module 20, the chip module 20 continuously abuts against the elastic elements 40, so that the elastic elements 40 cause the elastic deformation. The elastic elements 40 are always located on the movement path of the chip module 20, thereby the terminals 23 of the chip module 20 have a good contact with the contacting portions 11 of the substrate 10.

The present invention further provides a method for assembling the electrical connection device, which includes the steps of:

Moving the chip module 20 over the substrate 10 and the chip module 20 abuts against one side of the restricting structure 30;

Moving the chip module 20 towards the substrate 10 along the restricting structure 30 till the terminals 23 are compressed and contacted with the contacting portions 11;

The chip module 20 moving a distance depending on the compression deformation of the terminals 23.

In the present invention, when the terminals of the chip module are compressed and contacted with the contacting portions of the substrate, the restricting structure may restrict the chip module to move the distance depending on the compression deformation of the terminals. During the movement of the chip module, the elastic element just causes deformation, which make the chip module move in the direction opposite to the deformation direction of the terminals so that the terminals have a good contact with the contacting portions.

FIGS. 7-11 illustrate a second embodiment of the present invention. The differences between the second embodiment and the first embodiment described above are as follows:

The restricting structure 30 is fixed on the substrate 10 and includes two opposite first restricting blocks 33 and two opposite second restricting blocks 34, which are all fixed on the substrate 10. The two first restricting blocks 33 are adjacent to the two second restricting blocks 34, and they are connected to form a whole and define a receiving space 14 for receiving the chip module 20.

Each supporting unit 15 integrally extends from each restricting block and is located in the receiving space 14.

There are two elastic elements 40 (alternatively, more than two elastic elements) located on one side of the second restricting blocks 34 respectively and corresponding to the receiving space 14.

Figure 7:
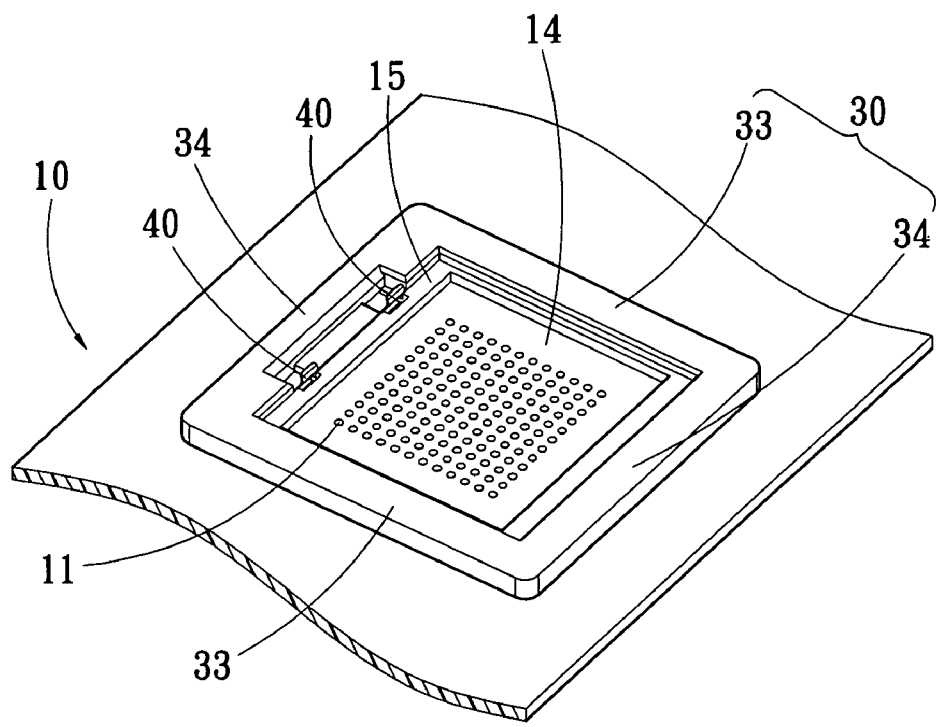
FIG. 7 is a perspective view of a substrate of a second embodiment of the present invention.
Figure 8:
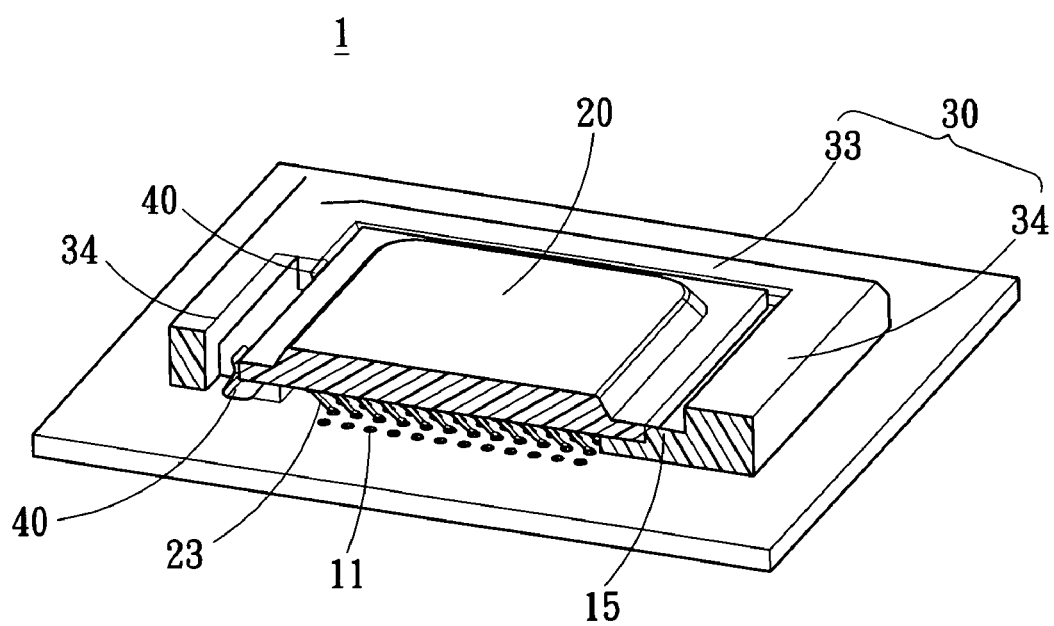
FIG. 8 is a partially cross-sectional view of the substrate in FIG. 7 and the chip module, after assembly.
Figure 9:
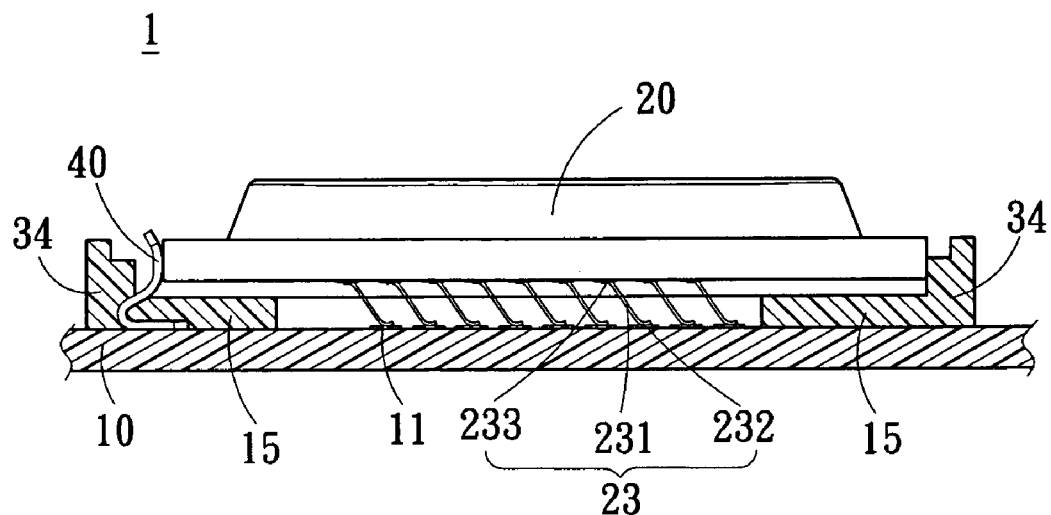
FIG. 9 is a cross-sectional assembled view of the chip module and the substrate in FIG. 8, before compression.

As shown in FIGS. 8-11, simultaneously, please refer to FIG. 7, when assembling, first, the chip module 20 is disposed in the receiving space 14 of the substrate 10 and the contacting ends 232 of the terminals 23 of the chip module 20 are pressed to contact with the contacting portions 11 of the substrate 10 correspondingly. The supporting units 15 may be used for supporting the chip module 2. The elastic elements 40 abut against one side edge of the chip module 20. The two opposite first restricting blocks 33 and the two opposite second restricting blocks 34 are respectively located on opposite sides of the chip module 20. The restricting structure 30 formed by the first restricting blocks 33 and the second restricting blocks 34 surrounds the chip module, one second restricting block 34 abutting against one side of the chip module 20.

Figure 10:
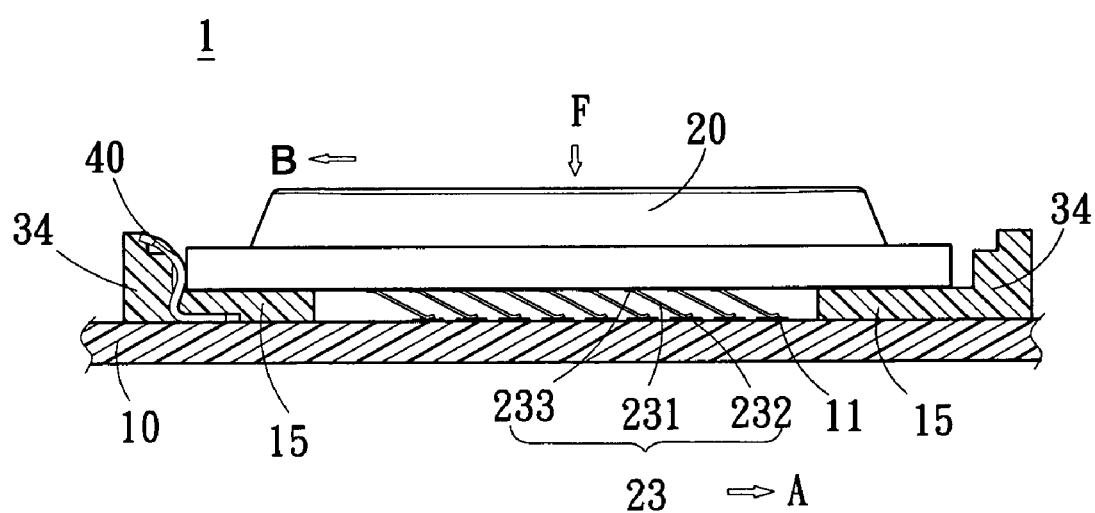
FIG. 10 is a cross-sectional assembled view of the chip module and the substrate in FIG. 9, after compression.
Figure 11:
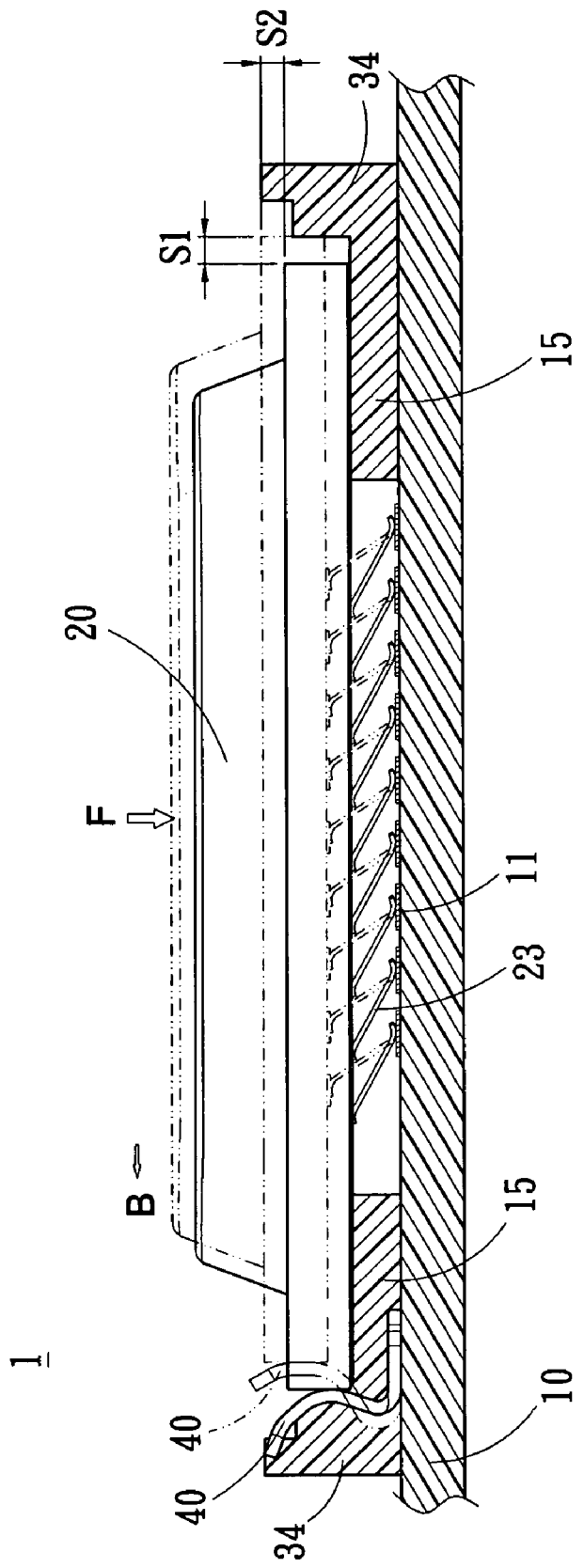
FIG. 11 is a cross-sectional assembled view of the chip module and the substrate in FIG. 9 and FIG. 10, before compression and after compression.

Please refer to FIG. 10 and FIG. 11, wherein FIG. 11 is a cross-sectional assembled view of the chip module and the substrate, before compression and after compression. In FIG. 11, dotted lines indicate the chip module and the substrate before compression and real lines indicate the chip module and the substrate after compression. The figures illustrate the changes of the chip module and the substrate clearly, before compression and after compression.

Then, keeping on exerting force (Force F in FIG. 10) to make the chip module 20 and the substrate 10 engage with each other closely. When the contacting end 232 of the terminals 23 are pressed on the contacting portions 11 of the substrate 10, the elastic portions 231 of terminals 23 will incline in one direction (the contacting ends 232 face to direction A in FIG. 5A) and produce an elastic deformation, and the terminals 23 will drive the chip module 20 to move in the direction opposite to the deformation direction of the terminals 23 (Direction B in FIG. 5). At the same time, the elastic elements 40 will push the chip module 20 to move in the direction opposite to Direction B in FIG. 5, thereby ensuring that the terminals 23 contact with the contacting portions 11 of the substrate 10, correspondingly.

At this time, the chip module 20 moves a distance relative to the substrate 10 depending on the compression deformation of the terminals 23. The horizontal movement distance is S1 and the vertical movement distance is S2. Since the supporting units 15 are disposed between the chip module 20 and the substrate 10 to support the chip module 20, it is avoided that the chip module 20 moves downwards continuously.

During the movement of the chip module 20, the two first restricting blocks 33 are respectively located on the left and the right sides of the movement path. The distance between the two second restricting blocks 34 ensures that the chip module 20 can move for the distance. The restricting structure 30 formed by the first restricting blocks 33 and the second restricting blocks 34 permits the chip module 20 to move along the specific direction of the movement path and restricts the chip module 20 not to move along the left and the right sides directions of the movement path, thereby the terminals 23 have a good contact with the contacting portion 11. During the movement of the chip module 20, the chip module 20 always abuts against the elastic elements 40, so that the elastic elements 40 cause the elastic deformation. Additionally, the elastic elements 40 are located on the movement path of the chip module 20, so the terminals 23 of the chip module 20 can have a good contact with the contacting portions 11 of the substrate 10.

Figure 12:
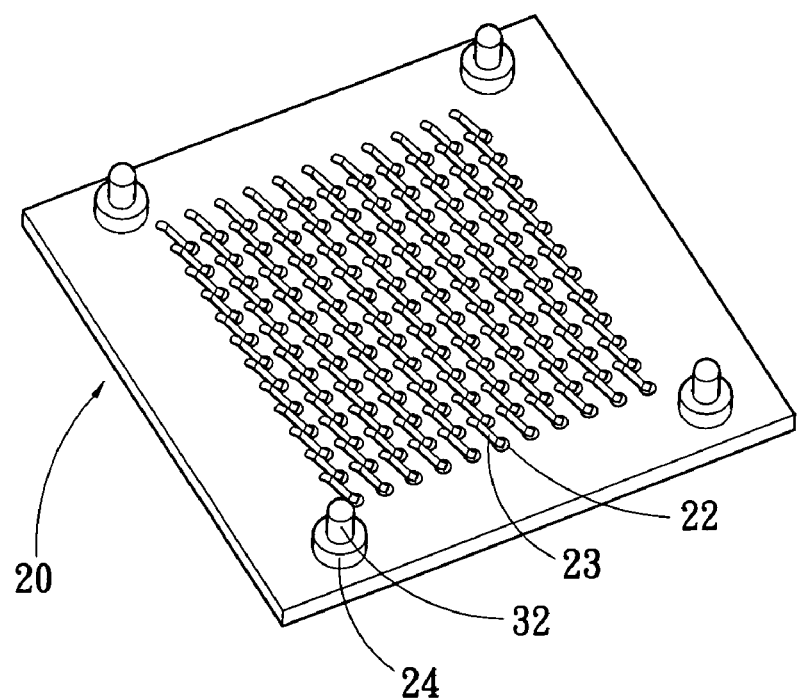
FIG. 12 is a perspective view of a chip module of a third embodiment of the present invention.
Figure 13:
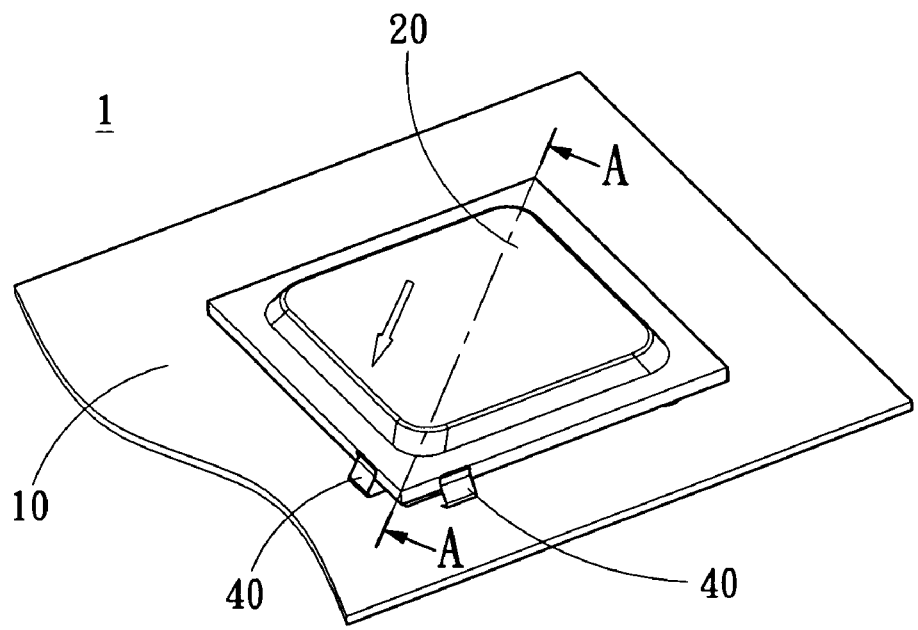
FIG. 13 is a perspective view of the chip module in FIG. 12 and the substrate, after assembly.
Figure 14:
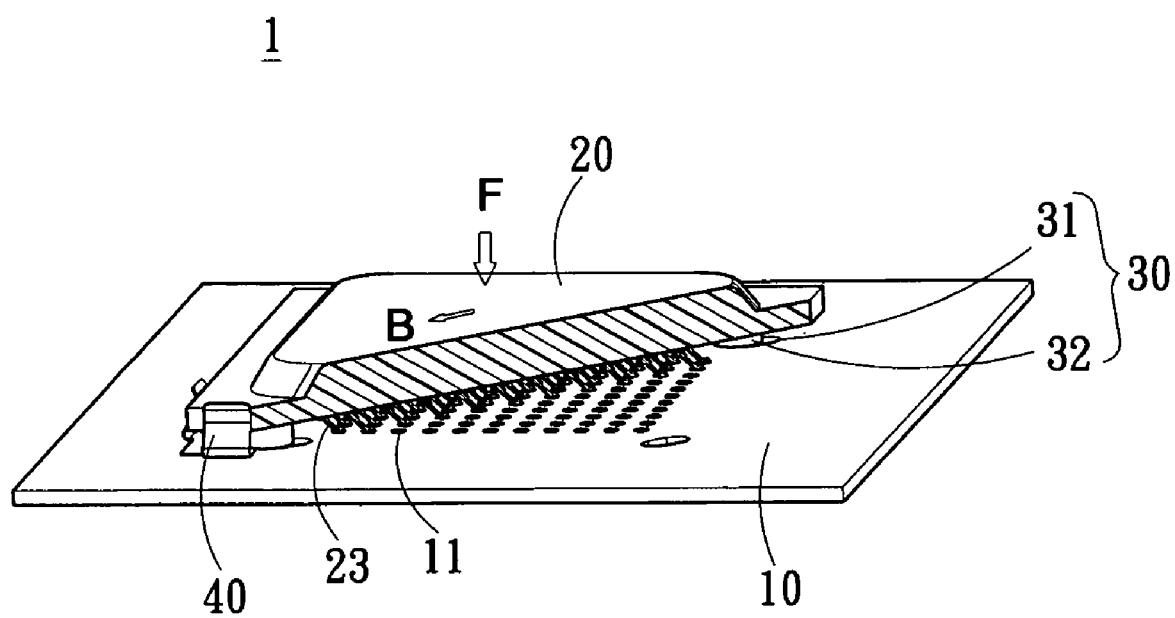
FIG. 14 is a cross-sectional view taken along line A-A of FIG. 13.

FIGS. 12-14 illustrate a third embodiment of the present invention. The differences between the third embodiment and the first embodiment described above are: the terminals 23 are disposed on the surface of the chip module in an inclined way, however, when the chip module 20 is fixed on the substrate 10, there are a certain angle between the terminals 23 and the contacting portions 11 of the substrate 10 and an angle which isn't a right angle or a straight angle between the arrangement direction of the terminals and the side edges of the substrate 10. When keeping on exerting force (Force F in FIG. 14) to make the chip module 20 and the substrate 10 engage with each other closely, there also forms an angle, which isn't a right angle or a straight angle, between the movement direction of the chip module 20 (Direction B in FIG. 14) and the side edges of the substrate 10, so that the terminals 23 of the chip module 20 have a good contact with the contacting portions 11 of the substrate 10.

What is claimed is:

1. An electrical connection device, comprising:
   a substrate having a plurality of contacting pads formed on a top surface thereof;
   a chip module, having an engaging surface; and
   a plurality of terminals formed on the engaging surface, the terminals inclining in one direction and pressed;
   wherein the chip module is pressed toward the substrate, and the contacting ends of the terminals contact with the plurality of contacting pads correspondingly;
   whereby the terminals are deformed along a deformation direction when the chip module is pressed, wherein the chip module and the contacting ends simultaneously move a horizontal displacement relative to the substrate along the deformation direction;
   at least one restricting structure, restricting the chip module to move along the deformation direction and restricting the horizontal displacement of the chip module relative to the substrate depending on the deformation of the terminals;
   wherein the restricting structure has at least two first restricting blocks which are respectively disposed on two opposite sides of the chip module for restricting the chip module to move along the deformation direction;
   wherein the restricting structure further has two second restricting blocks which are respectively disposed on two opposite sides of the chip module, the distance between the two second restricting blocks is larger than the length of the chip module a distance substantially equal to the horizontal movement distance of the chip module; and
   at least one elastic element, located on the movement path of the chip module, and continuously against the chip module during the horizontal displacement of the chip module.

2. The electrical connection device as claimed in claim 1, wherein the restricting structure includes a track formed on the substrate along the deformation direction and a fixing block is disposed on the bottom surface of the chip module, the length of the track is substantially equal to the horizontal displacement of the chip module, and the fixing block is restricted between two sides of the track.

3. The electrical connection device as claimed in claim 1, wherein at least the one first restricting block and at least the one second restricting block are adjacent to each other.

4. The electrical connection device as claimed in claim 1, wherein the first restricting blocks are fixed on the substrate.

5. The electrical connection device as claimed in claim 1, wherein the second restricting blocks are fixed on the substrate.

6. The electrical connection device as claimed in claim 1, wherein at least one supporting unit is disposed between the substrate and the chip module for supporting the chip module.

7. The electrical connection device as claimed in claim 1, wherein the elastic element is a tensile resistance spring, of which one end is fixed on the substrate and the other end abuts against the chip module.

8. The electrical connection device as claimed in claim 1, wherein each terminal has a contacting end which is pressed to contact with the corresponding pad.

9. The electrical connection device as claimed in claim 3, wherein the first restricting block and the second restricting block are connected to form a unit and surround the chip module to define a receiving space in which the chip module is received.

10. The electrical connection device as claimed in claim 7, wherein before the terminals are compressed and contacted the contacting pads, the elastic element causes the chip module to move in a direction opposite to the movement direction of the chip module for ensuring that the terminals guide and contact the contacting pads correspondingly.

11. An electrical connection device, comprising:
   a substrate having a plurality of contacting pads formed on a top surface thereof;
   a chip module, having an engaging surface; and
   a plurality of terminals formed on the engaging surface, the terminals inclining in one direction and being compressed; and
   wherein the chip module is pressed toward the substrate, and the contacting ends of the terminals contact with contacting the plurality of contacting pads correspondingly; and
   whereby the terminals are deformed along a deformation direction when the chip module is pressed, wherein the chip module and the contacting ends simultaneously move a horizontal displacement relative to the substrate along the deformation direction;
   at least one restricting structure surrounding the chip module restricting the chip module to move along the deformation direction;
   wherein the restricting structure has at least two first restricting blocks which are respectively disposed on two opposite sides of the chip module for restricting the chip module to move along the deformation direction;
   wherein the restricting structure further has two second restricting blocks which are respectively disposed on two opposite sides of the chip module, the distance between the two second restricting blocks is larger than the length of the chip module a distance substantially equal to the horizontal movement distance of the chip module;
   wherein at least one supporting unit extends from the restricting structure and is located between the substrate and the chip module for supporting the chip module.

* * * * *